United States Patent [19]

Conner et al.

[11] Patent Number: 5,687,130

[45] Date of Patent: Nov. 11, 1997

[54] MEMORY CELL WITH SINGLE BIT LINE READ BACK

[75] Inventors: James L. Conner, Rowlett; Rohit L. Bhuva; Michael J. Overlaur, both of Plano, all of Tex.

[73] Assignee: Texas Instruments Incorporated, Dallas, Tex.

[21] Appl. No.: 346,707

[22] Filed: Nov. 30, 1994

[51] Int. Cl.⁶ .................................................. G11C 13/00
[52] U.S. Cl. ................ 365/230.01; 365/203; 365/189.01
[58] Field of Search ................... 365/230.01, 189.01, 365/149, 203

[56] References Cited

U.S. PATENT DOCUMENTS

| | | | |
|---|---|---|---|
| 5,061,049 | 10/1991 | Hornbeck | 359/224 |
| 5,079,544 | 1/1992 | DeMond et al. | 340/701 |
| 5,105,369 | 4/1992 | Nelson | 364/525 |
| 5,594,701 | 1/1997 | Asaka et al. | 365/203 |

OTHER PUBLICATIONS

U.S. application No. 08/002,627, Korner et al., filed Jan. 11, 1993.

Primary Examiner—Terrell W. Fears
Attorney, Agent, or Firm—Robert C. Klinger; James C. Kesterson; Richard L. Donaldson

[57] ABSTRACT

The spatial light modulator (30) of the DMD type having associated memory cells (10) with a single bit line memory read back architecture (54). The memory cells (10) include a charge equalization switch (50) comprising a transistor connected across the bit lines (16,18) of the memory cell (10). This charge equalization transistor (50) is momentarily turned on ($T_3$) to balance residual charge on the memory cell bit lines (16,18), after a write cycle ($T_2$) but before the read cycle ($T_4$). When the memory cell contents are subsequently read ($T_4$), the memory cell contents will not change state. A single amplifier (54) is connected to one bit line for reading the memory cell contents. The single bit line (18) memory read back architecture provides a more efficient circuit layout to the spacing constraints required with DMDs, consumes less power than designs with a differential amplifier, and additionally, provides yield improvements.

14 Claims, 2 Drawing Sheets

MEMORY CELL WITH SINGLE BIT LINE READ BACK

CROSS REFERENCE TO A RELATED APPLICATION

Cross referenced is made to the following Co-pending patent applications:

| Serial Number | Filing Date | Title |
| --- | --- | --- |
| 08/002,627 | 01/11/93 | Pixel control Circuitry for Spatial Light Modulator |
| | Filed Herewith | Spatial Light Modulator with Reduced Possibility of an On State Defect |

1. Field of the Invention

The present invention is generally related to monolithic memory devices, and more particularly to spacial light modulators having arrays of pixels and associated memory cells.

2. Background of the Invention

Monolithic memory devices are typically fabricated as large arrays of memory cells. Each of these memory cells may be of the type known as Static Random Access Memory (SRAM) or Dynamic Random Access Memory (DRAM) cells. The architecture of memory devices is continuously being improved, with fast read/write access times, and the available commercial fabricating equipment permitting the fabrication of memory devices exceeding 4 million bits of memory.

Memory devices are typically designed so that each memory cell of the array can be indiVidually loaded (written to) with data, and also individually read to ensure the successful loading of data into the memory cells. To provide this read function, typical prior art memory cell arrays, such as that depicted in FIG. 1, utilize a differential amplifier coupled across two bit lines feeding data to the memory cells, such as a typical six transistor SRAM cell generally shown at 10. The SRAM cell shown in FIG. 1 is loaded by supplying a logic 0 or 1 signal on load line 12, this signal being converted to a differential signal by a transparent latch shown at 14. This differential data is then provided on a pair of bit lines identified at 16 and 18. This differential data is loaded into a chosen memory cell 10 by biasing (addressing) a pair of respective MOS pass transistors generally shown at 20. Bit lines 16 and 18 usually feed data to several memory cells 10. When transistors 20 are subsequently turned off, the data remains stored in the memory cell across inverters 22, the contents depicted at nodes Q and $\bar{Q}$. To subsequently read the contents of a selected memory cell, latch 14 is first disabled and put into the tri-state mode. Next, each of the pass transistors 20 are again enabled, whereby the contents of the addressed memory cell are provided on bit lines 16 and 18. The inputs of a differential amplifier 24 are connected to these bit lines, and converts the differential memory content to a single line shown at 26.

This prior art design is adequate for allowing high speed read and write operations, however, the draw back of this design is that using a differential amplifier to permit a read operation consumes a relatively large area on a monolithic device, and also consumes a lot of power.

Spatial Light Modulators, particularly those of the Digital Micromirror Device (DMD) type such as that manufactured by Texas Instruments Incorporated, of Dallas, Tex., incorporate arrays of memory cells into the monolithic SLM device. In the case of the DMD, a dense array of micro mirrors are fabricated over an array of memory cells. Each memory cell is associated with one or more mirrors, whereby the contents of the memory cells determine the deflection state of the associated micro mirrors when the mirrors are addressed. Both linear arrays and area arrays of pixels are currently being developed. The micro mirrors comprising the SLM array currently have dimensions of approximately 17 micrometers square, and may be implemented in linear arrays of 64×7,056 pixels, and area arrays of 1,000×2,000 pixels. For a more detailed discussion of DMDs and their associated application in hard copy electrostatic printers and displays such as large screen televisions, see U.S. Pat. No. 5,061,049 to Hornbeck entitled "Spatial Light Modulator and Method", U.S. Pat. No. 5,079,544 to DeMond et al, entitled "Standard Independent Digitized Video System", and U.S. Pat. No. 5,105,369 to Nelson, entitled "Printing System Exposure Module Alignment Method and Apparatus of Manufacture", each patent being assigned to the same assignee of the present invention, and the teachings of each incorporated herein by reference.

The DMD is a unique SLM whereby the movable pixel mirrors are actually fabricated over an array of associated memory cells and control circuitry. Due to the small dimensions of these pixel elements, the dimensions of corresponding memory cells and control circuitry need to be small as well. To perform diagnostic testing of the memory cells, these memory cells are first loaded with data, and the subsequently read to confirm that the memory cells are functional. However, given the unique layout of DMD devices and their small dimensions, providing a series of conventional differential amplifiers to facilitate the read operation of all memory cells consumes excessively large areas of the circuit; and also consumes a lot of power. Moreover, the complexity of the fabricated differential amplifier increases the likelihood that defects can occur during fabrication, which can lead to lower production yields of the device. Accordingly, a technique and associated circuitry permitting the reading of memory cells which reduces circuit complexity and necessary wafer area, and increases manufacturing yields would be beneficial to SLMs, and particularly those of the DMD type.

SUMMARY OF THE INVENTION

A technical advantage of the present invention is a memory cell with a signal bit line read back architecture. With this architecture, the need for a differential amplifier is eliminated. Moreover, the possibility of the memory cell changing states under certain conditions, such as when the data transfer gates between the memory cell and the bit lines are opened, is eliminated.

The present invention includes providing a single input buffer amplifier connected to only one bit line. To avoid the possibility that parasitic capacitance stored on the bit lines might inadvertently change the memory cell states, a charge transfer gate is provided between the two bit lines. This charge transfer gate is enabled after the loading of the memory cell to equalize charge on the bit lines, but before the transfer gates are subsequently enabled to read the cell contents. This switch, which is preferable a n-channel MOS transistor, equally distributes the charge on the bit lines before reading the cell contents. With the transparent latch used to load the memory cell assuming the tri-state high impedance mode, and this charge transfer gate again being turned off, the memory cell pass gates are then enabled to provide the memory cell contents to the bit lines. The single input amplifier connected to one bit line is then sensed by control circuitry to ascertain the memory cell contents. With the present invention, fewer transistors are required than those memory cells incorporating a differential amplifier. In addition, memory cell stability is enhanced, allowing a more efficient layout to the spacing constraints required with DMDs, and providing yield improvement.

The memory cell architecture according to the present invention is ideally suited for DMD type SLMs, but is also ideally suited for any device implementing an array of memory cells whereby the read operation of memory cells takes place well after the write cycle operation. That is to say, the memory cell contents are not read during what is conventionally known as the "critical data cycle". The speed of the current design is sufficient for use in a DMD device. In a typical DMD operation, there is surf dent time to both equalize the charge on the bit lines, and then subsequently read these bit lines with a single input buffer amplifier during the testing sequence.

If, for example, a logic "one" is loaded into the memory cell, the Q node of the memory cell would be loaded with +5 volts, and the $\bar{Q}$ node would have a potential of 0 volts. When the equalizing transistor is enabled, the parasitic charges on both of the bit lines will equalize to an intermediate and approximately average voltage, such as +2.5 volts. Thus, the bit lines are charge stabilized before the read back of the subsequent memory cell. Thereafter, when the pass transistors are enabled, each of the bit lines will only change 2.5 volts in one direction or the other, thus keeping the memory cell from inadvertently changing states.

DETAIL DESCRIPTION OF THE PREFERRED EMBODIMENT

Figure 1:
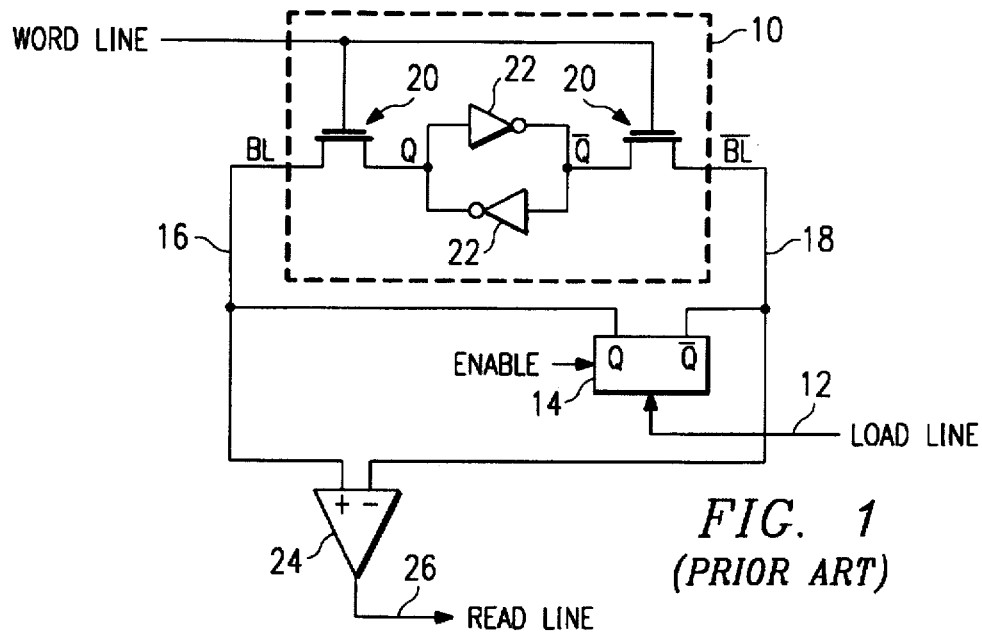
FIG. 1 is a schematic representation of a prior art memory cell architecture, whereby a differential amplifier is used to read back the contents of the memory cell.
Figure 2:
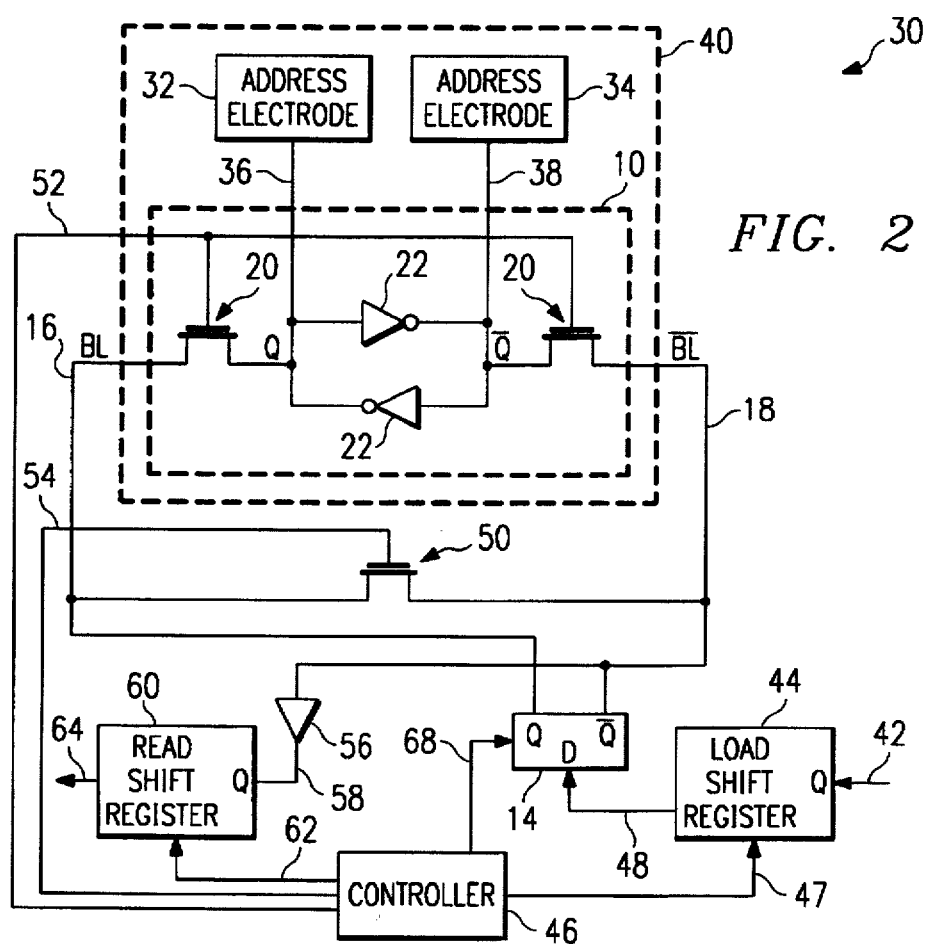
FIG. 2 is a schematic diagram of the present invention with a single bit line memory read back architecture, including a charge equalization transistor between the bit lines for balancing the charge on the bit lines before a memory read back sequence.

According to the preferred embodiment of the present invention shown in FIG. 2, a spatial light modulator, such as of the DMD type manufactured by Texas Instruments of Dallas, Tex. is generally shown at 30. SLM 30 is seen to include a conventional static random access memory (SRAM) cell generally shown at 10. This SRAM memory cell 10 is configured from six transistors, and may be fabricated using CMOS, NMOS or PMOS technology. The basic elements, associated connections and operation of memory cell 10 has already been described with reference to FIG. 1 under the section entitled "Background of the Invention", whereby elements with like numerals refer to like elements.

A pair of address electrodes shown at 32 and 34 are connected to the Q and $\bar{Q}$ nodes of memory cell 10 via a pair of electrode etch lines 36 and 38, respectively. Each pixel of SLM 30 has associated therewith a deflectable torsion micro mirror 40, shown in phantom, which is controllably deflected as a function of the potential on these address electrodes 32 and 34. Cross reference is hereby made to U.S. Pat. No. 5,061,049 to Hornbeck, entitled "Spatial Light Modulator and Method", which discusses in detail the operation of pixels of the DMD type. For purposes of illustration and clarity, SLM 30 is shown in FIG. 2 as having a single pixel including mirror 40, although a typical SLM 30 would have thousands of mirrors 40 and memory cells 10, and associated circuitry.

Pixel data to be loaded into memory cell 10 is provided on load line 42, which in turn, is connected to the input of load shift register 44. This data is clocked into load shift register 44 by controller 46, and ultimately stepped to input D of transparent latch 14 via line 48. Latch 14 is enabled from a tri-state condition by controller 46 via line 68. Latch 14 may provide level conversion of this data if needed, and provides a true and compliment of the data in differential form to bit lines 16 and 18. To load this differential data from bit lines 16 and 18 into memory cell 10, controller 46 turns pass transistors 20 on by providing a write signal on line 52, which is connected to the gates of pass transistors 20. This write signal preferably comprises a pulse, whereby after the termination of the pulse transistors 20 return to their off state and the memory contents remain latched across inverters 22 at nodes Q and $\bar{Q}$.

According to the preferred embodiment of the present invention, SLM 30 is further provided with an equalization switching transistor 50. Transistor 50 is preferably a N-channel MOS transistor connected across the bit lines 16 and 18, with the source terminal connected to bit line 16 and the drain terminal connected to bit line 18. The gate terminal of transistor 50 is connected to controller 46 via control line 54. As will be described in more detail shortly, the closing of equalization transistor 50 permits the residual parasitic capacitance on bit lines 16 and 18 to be equalized, after the write cycle of data into memory cell 10, but before reading the contents of the memory cell 10.

A single input buffer amplifier 56 has its input connected to one bit line, and in the preferred embodiment, to bit line 18 although this is a mere design choice based on signal levels. Output amplifier 56 could also be of the inverting type, depending on the desired signal levels wanted for sensing. The output of amplifier 56 is connected via signal line 58 to the Q input of a read shift register 60. Controller 46 provides a clock pulse via control line 62 to shift register 60 when it is desired to read the contents of the memory cell 10, with the memory contents ultimately being shifted to output line 64. When data is not being loaded into memory cell 10, and especially during the read cycle just described, controller 46 disables transparent latch 14 via control line 48 to put its Q and $\bar{Q}$ outputs in a high impedance tri-state condition.

Operation

The advantages and attributes of SLM 30 can be further appreciated upon a discussion of an illustrative writing and reading cycle of memory cell 10. For purposes of illustration, timing diagram FIG. 3 will be discussed in reference to FIG. 2.

First, to load memory cell 10 with the logic "one", for instance, this data is loaded via input line 42 into load shift register 44, and clocked by controller 46 via line 47 to the output of register of 44. This register output is provided to the D input of transparent latch 14 via line 48, as shown. This logic "one" is represented as timing signal 100 in FIG. 3, with the leading edge of this logic "one" being provided to the D input of latch 14 at time $T_1$. Next, latch 14 is maintained enabled by control line 68, as shown by timing signal 102, whereby latch 14 provides level conversion of the input data. Differential data will be provided from latch terminals Q and $\overline{Q}$ to bit lines 16 and 18, respectively, represented in FIG. 3 as lines 104 and 106.

To latch this logic "one" into memory cell 10, controller 46 provides a clock pulse on line 52 and the gates of pass transistors 20 at time $T_2$, as represented on timing line 110. This clock pulse momentarily enables both switch or pass transistors 20, thereby connecting bit lines 16 and 18 to memory cell 10 nodes Q and $\overline{Q}$. Thus, memory cell 10 is loaded at $T_2$, as represented in the timing diagram as lines 112 and 114. At the completion of the write pulse provided to transistors 20, these transistors 20 will again become disabled. However, the contents of memory cell 10 will remain latched and stored at nodes Q and $\overline{Q}$, as shown on line 112 and 114 of FIG. 3.

Figure 3:
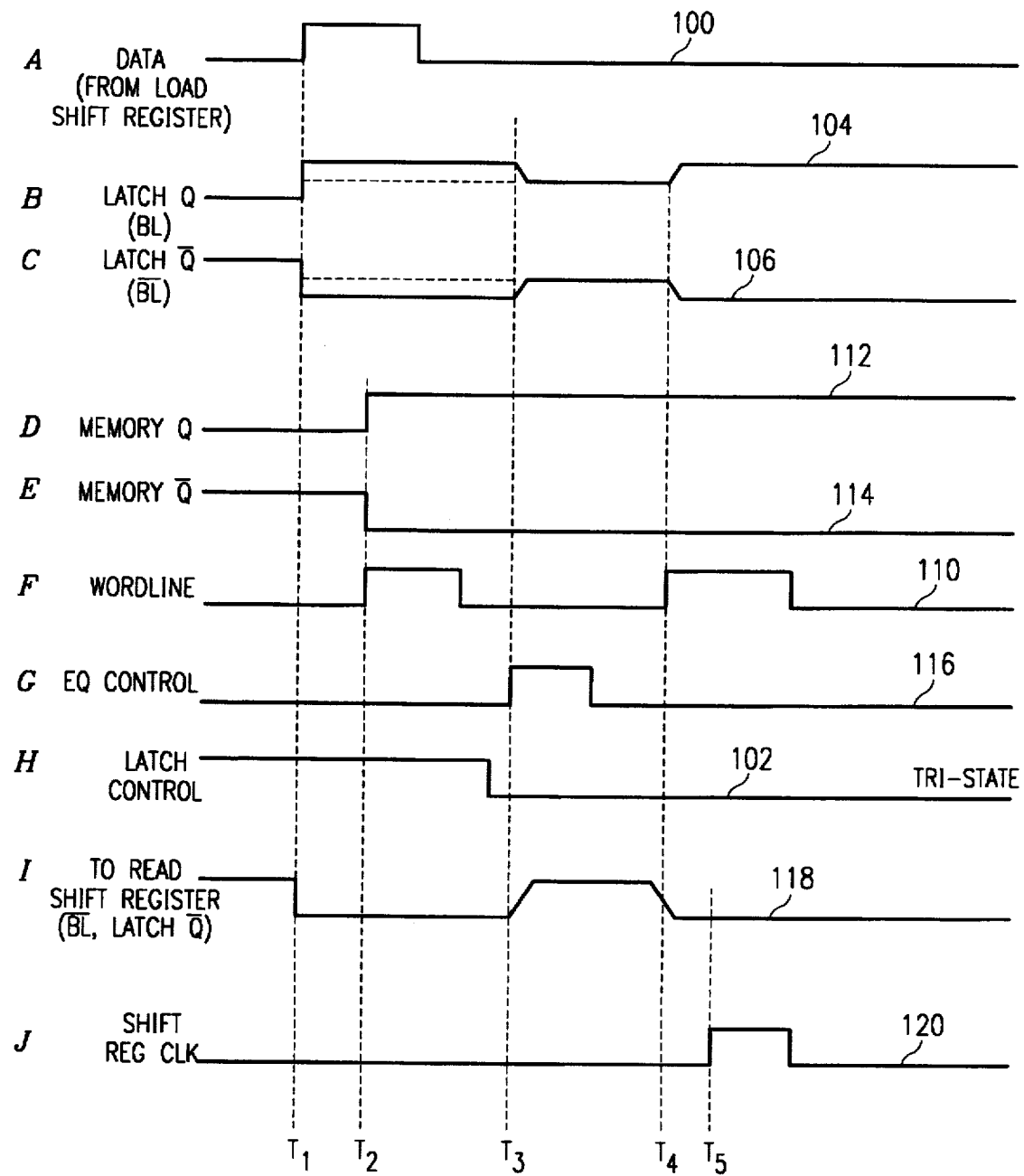
FIG. 3 is a timing diagram of the present invention illustrating the timing at which the memory cell is loaded, the bit lines charged equalized, and the memory cell read back.

Now, to permit a single bit line read back of memory cell 10 according to the preferred embodiment of the present invention, continued reference to FIG. 3 is directed. At time $T_3$, and controller 46 puts transparent latch 14 in the tri-state high impedance condition, as shown on line 102 of FIG. 3, controller 46 provides a control pulse on line 54 to momentarily enable equalization transistor 50, represented as line 116 in FIG. 3. This conducting transistor 50 allows the residual charge on bit lines 16 and 18 to equalize between the two since latch 14 is in the tri-state high impedance condition. For instance, after writing a logic "one" into memory cell 10 and disabling pass transistors 20, bit line 16 will still retain approximately a +5 volt potential. Conversely, bit line 18 will still maintain a 0 volt potential. After momentarily turning transistor 50 on, the residual charge between bit lines 16 and 18 will balance, with each bit line then having an intermediate and approximately 2.5 volt potential on lines 104 and 106 at time $T_3$. Transistor 50 is only turned on for sufficient time period, such as 1 millisecond, to allow the residual charge on bit lines 16 and 18 to equalize, and then the transistor is turned off.

Now, at time $T_4$, and depicted on timing line 110, controller 46 sends a pulse via ling 52 to the gate of pass transistors 20 causing them to conduct again. With controller 46 maintaining transparent latch 14 in the tri-state mode, the +5 volt potential from memory cell node Q is communicated to bit line 16. Similarly, the 0 volt potential from memory cell node $\overline{Q}$ is communicated to bit line 18, as shown on timing lines 104 and 106 at time $T_4$. Because bit lines 16 and 18 were charged equalized to +2.5 volts before providing the read pulse to transistors 20, memory cell 10 will not change states, which might otherwise occur if bit lines 16 and 18 were charge unbalanced before the read pulse.

Single bit line memory read back is possible with the input of amplifier 54 connected to bit line 18. The output of amplifier 54 always reflects the level of bit line 18, as shown by timing line 113. The output of amplifier 54 is connected to the Q input of the read shift register 60 via line 58, this data of being clocked to output 64 by controller 46 at time $T_5$. This clocking pulse provided on line 62 by controller 46 to read shift register 60 is shown on timing line 120.

While the input of amplifier 54 is shown as being connected to bit line 18, it could also be connected to bit line 16 instead, if desired. In the present embodiment, a 0 volt potential at the output of amplifier 54 corresponds to reading a logic "one" from memory cell 10. If the input, of amplifier 54 is connected to bit line 16, then a +5 volt output from amplifier 54 would correspond to a logic "one" being read from memory cell 10.

One advantage of the present invention is a single bit line memory read back architecture. This is possible due to the implementation of equalizer transistor 50 providing bit line charge balancing prior to transferring the memory cell 10 contents to bit lines 16 and 18.

Another advantage of the present invention is utilizing only a single input buffer amplifier 54 to provide a read operation, rather than a complex and relatively large differential amplifier. Thus, SLMs such as of the DMD type can realize a more efficient circuit lay out, as dictated by spacing constraints, and additionally, realize yield improvement during the manufacturing process. The time required for transistor 50 to first equalize bit lines 16 and 18 before writing the contents of the memory cell 10 to change these bit lines is negligible during a typical testing procedure. Typically, transistor 50 needs to only be conducting for one millisecond to achieve a charge balance. Transistor 50 can be implemented in CMOS, PMOS or NMOS technology, similar to that of pass transistors 20 and inverters 22 of memory cell 10. Likewise, amplifier 54 can be fabricated using similar technology.

Though the invention has been described with respect to a specific preferred embodiment, many variations and modifications will become apparent to those skilled in the art upon reading the present application. It is therefore the intention that the appended claims be interpreted as broadly as possible in view of the prior art to included all such variations and modifications. For instance, while 0 and 5 volt logic levels are implemented, other levels could be implemented. Moreover, due to other design considerations, the equalizing voltage of the bit lines may not be exactly half the difference between the lines if one line exhibits more capacitance than the other, for instance. While the present invention is embodied in an SLM in the preferred embodiment, other memory cell arrays and devices implementing the same can benefit from the present invention, and are within the scope of the present invention. Other memory cell architectures such as DRAM cells, and cells using more or less transistors than the typical six transistor SRAM cell, are also covered by the present invention.

We claim:

1. A monolithic device, comprising:
   at least one memory cell;
   a pair of bit lines coupled to said memory cell;
   means coupled to said bit lines for selectively equalizing a charge on said bit lines; and
   memory read means coupled to only one said bit line for reading a content of said memory cell.

2. The device as specified in claim 1 wherein said charge equalizing means comprises a switch coupled across said bit lines.

3. The device as specified in claim 2 wherein said switch comprises a transistor.

4. The device as specified in claim 1 wherein said memory cell comprises a SRAM cell.

5. The device as specified in claim 1 wherein said memory read means comprises a buffer amplifier having an input coupled to only one said bit line.

6. The device as specified in claim 1 further comprising a spatial light modulator functionally coupled to said memory cell.

7. The device as specified in claim 6 wherein said spatial light modulator comprises a micro mirror positioned over said memory cell, and said memory cell is coupled to a pair of address electrodes positioned under said micro mirror.

8. The device as specified in claim 4 wherein said memory cell comprises a pair of pass transistors, one coupled to each of said bit lines, for selectively placing said memory cell content on said bit lines.

9. The device as specified in claim 8 wherein said charge equalizing means comprises a switch coupled across said bit lines, wherein said switch is controllable independent of said pass transistors.

10. A method of operating a memory cell coupled to a pair of bit lines, comprising the steps of:
   a) loading said memory cell via said bit
   b) equalizing a charge on said bit lines; and
   c) reacting a content of said memory cell by sensing only one said bit line.

11. The method as specified in claim 10 wherein said step b) is performed by momentarily closing a switch connected between said bit lines.

12. The method as specified in claim 11 wherein said memory cell contents are read after said switch is opened.

13. The device as specified in claim i further comprising an array of display elements, one said memory cell being associated with each said display element.

14. The device as specified in claim 13 wherein said display elements comprise a micromirror positioned over said memory cell.

* * * * *